(12) United States Patent
Hsu et al.

(10) Patent No.: US 11,317,526 B2
(45) Date of Patent: Apr. 26, 2022

(54) ELECTRONIC DEVICE AND DISPLAY THEREOF

(71) Applicant: ASUSTeK COMPUTER INC., Taipei (TW)

(72) Inventors: Kai-Chieh Hsu, Taipei (TW); Chih-Wei Chuang, Taipei (TW); Yu-Chiao Chang, Taipei (TW); Tsung-Ju Chiang, Taipei (TW); Szu-Han Lai, Taipei (TW); Yaw-Huei Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/936,523

(22) Filed: Jul. 23, 2020

(65) Prior Publication Data

US 2021/0045256 A1 Feb. 11, 2021

Related U.S. Application Data

(60) Provisional application No. 62/882,633, filed on Aug. 5, 2019.

(30) Foreign Application Priority Data

Jul. 7, 2020 (TW) .................................. 109122940

(51) Int. Cl.
*H05K 5/02* (2006.01)
*H05K 5/00* (2006.01)
(52) U.S. Cl.
CPC ......... *H05K 5/0204* (2013.01); *H05K 5/0017* (2013.01)

(58) Field of Classification Search
None
See application file for complete search history.

(56) References Cited

U.S. PATENT DOCUMENTS 6,003,260 A * 12/1999 Chang ...................... G09F 1/12
248/472
6,189,842 B1 * 2/2001 Bergeron Gull ..... F16M 11/105
248/125.1
(Continued)

FOREIGN PATENT DOCUMENTS

CN 202972432 U 6/2013
CN 203348849 U 12/2013
(Continued)

*Primary Examiner* — Xanthia C Cunningham
(74) *Attorney, Agent, or Firm* — McClure, Qualey & Rodack, LLP (57) ABSTRACT

An electronic device and a display thereof are provided. The electronic device includes a display and a supporting device. The display includes a display panel, a back cover, and a connecting member. The back cover is disposed on the display panel, and includes an inner surface, an outer surface opposite to the inner surface, and a mounting hole penetrating the inner surface and the outer surface. The inner surface faces the display panel. The mounting hole is disposed on a central region of the back cover. The connecting member is disposed on the inner surface at a position corresponding to the mounting hole, and includes a screw hole. The supporting device includes a detachable fixer connected to the screw hole. Thus, it is convenient for a user to connect the display to different supporting devices.

9 Claims, 8 Drawing Sheets

(56) References Cited

U.S. PATENT DOCUMENTS

| | | | | |
|---|---|---|---|---|
| 6,739,566 B1* | 5/2004 | Kao | ................ | A47G 33/126 248/519 |
| 7,675,743 B2* | 3/2010 | Tae | ................ | G06F 1/1626 361/679.21 |
| 7,744,055 B2* | 6/2010 | Zeng | ................ | F16M 11/10 248/447 |
| 7,798,457 B2* | 9/2010 | Chih | ................ | F16M 11/10 248/284.1 |
| 7,984,883 B2* | 7/2011 | Li | ................ | H04N 1/00127 248/125.7 |
| 8,498,101 B2 | 7/2013 | Chen et al. | | |
| 8,520,371 B2* | 8/2013 | Peng | ................ | F16M 11/105 361/679.01 |
| 8,599,570 B2* | 12/2013 | Ke | ................ | F16M 11/105 361/755 |
| 8,674,833 B2* | 3/2014 | Johnston | ................ | A47F 7/024 340/568.1 |
| 8,763,977 B2* | 7/2014 | Huang | ................ | F16M 11/10 248/456 |
| 8,934,232 B2* | 1/2015 | Hsu | ................ | G06F 1/1626 361/679.27 |
| 9,848,071 B2* | 12/2017 | Thiers | ................ | H04M 1/0274 |
| 9,930,943 B2* | 4/2018 | Lach | ................ | H04M 1/04 |
| 10,771,663 B2* | 9/2020 | Chin | ................ | H05K 5/0247 |
| 2008/0297438 A1* | 12/2008 | Lin | ................ | A47G 1/142 345/30 |
| 2009/0020672 A1* | 1/2009 | Lai | ................ | F16M 11/105 248/274.1 |
| 2011/0192857 A1* | 8/2011 | Rothbaum | ................ | F16M 11/041 220/694 |
| 2014/0227985 A1* | 8/2014 | Sanford | ................ | H01Q 3/08 455/90.3 |
| 2016/0296018 A1* | 10/2016 | Ahn | ................ | F16M 11/041 |
| 2018/0310422 A1* | 10/2018 | Yu | ................ | B25J 19/0029 |
| 2019/0011952 A1* | 1/2019 | Galipeau | ................ | F16M 11/041 |
| 2019/0309894 A1* | 10/2019 | Hasegawa | ................ | F16M 11/2014 |

FOREIGN PATENT DOCUMENTS

| | | |
|---|---|---|
| CN | 204962187 U | 1/2016 |
| CN | 208334878 U | 1/2019 |
| TW | M304886 U | 1/2007 |
| TW | I405528 B | 8/2013 |

\* cited by examiner

ELECTRONIC DEVICE AND DISPLAY THEREOF

CROSS-REFERENCE TO RELATED APPLICATION

This application claims the priority benefit of Taiwan application serial No. 109122940, filed on Jul. 7, 2020 and US provisional application Ser. No. 62/882,633, filed on Aug. 5, 2019. The entirety of the above-mentioned patent application is hereby incorporated by reference herein and made a part of the specification.

BACKGROUND OF THE INVENTION

Field of the Invention

The disclosure relates to an electronic device.

Description of the Related Art

An electronic device usually cooperates with a supporting device to increase convenience. Due to heavy weight, a large-sized electronic device fails to connect to a common supporting device, such as, a tripod head. The large-sized electronic device usually only cooperates with a tailor-made supporting structure, which is inconvenient.

BRIEF SUMMARY OF THE INVENTION

The disclosure provides an electronic device, including a display and a supporting device. The display includes a display panel, a back cover, and a connecting member. The back cover is disposed on the display panel. The back cover includes an inner surface, an outer surface opposite to the inner surface, and a mounting hole penetrating the inner surface and the outer surface. The inner surface faces the display panel. The mounting hole is disposed on a central region of the back cover. The connecting member is disposed on the inner surface at a position corresponding to the mounting hole, and includes a screw hole. The supporting device includes a detachable fixer connected to the screw hole.

The disclosure further provides a display, applied to connect to a supporting device including a detachable fixer. The display includes a display panel, a back cover, and a connecting member. The back cover is disposed on the display panel. The back cover includes an inner surface, an outer surface opposite to the inner surface, and a mounting hole penetrating the inner surface and the outer surface. The inner surface faces the display panel. The mounting hole is disposed on a central region of the back cover. The connecting member is disposed on the inner surface at a position corresponding to the mounting hole, and includes a screw hole. The display is connected to the detachable fixer through the screw hole to connect to the supporting device.

DETAILED DESCRIPTION OF THE EMBODIMENTS

Figure 1:
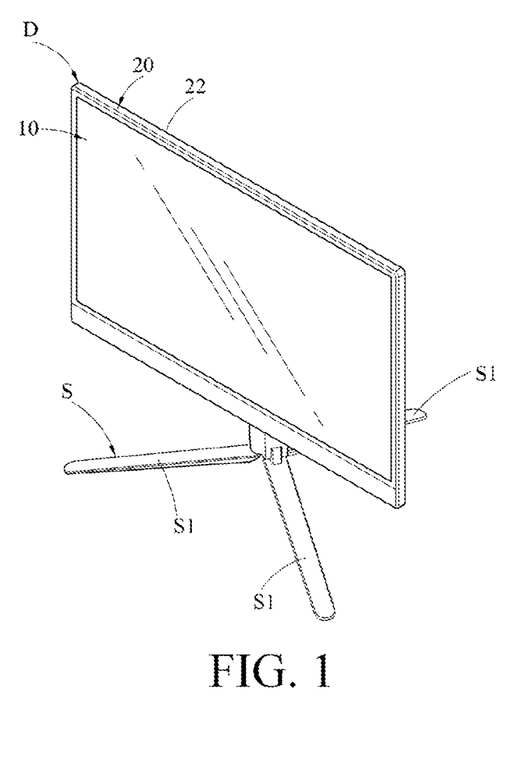
FIG. 1 is a schematic diagram of an electronic device according to the disclosure.
Figure 2:
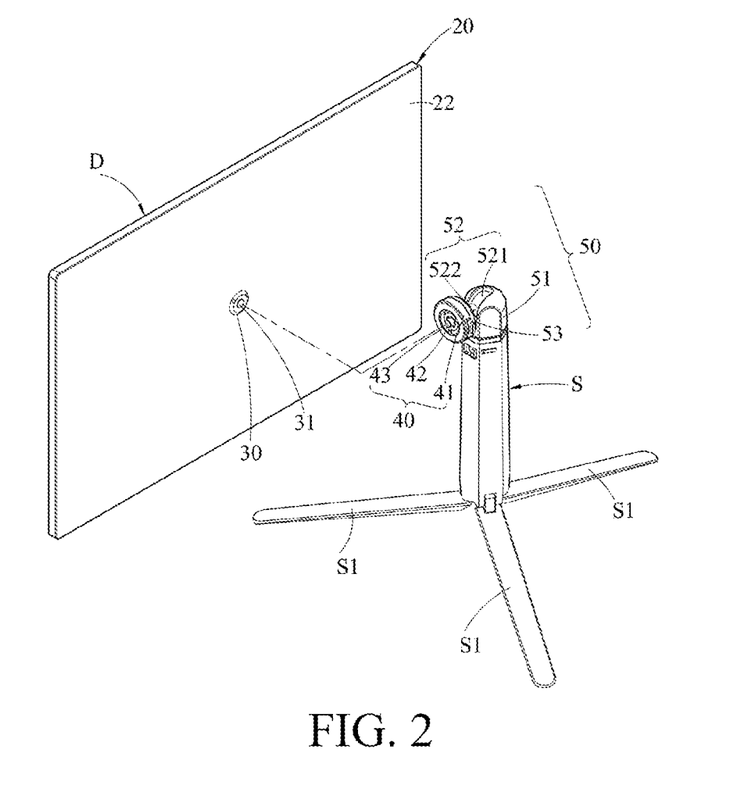
FIG. 2 is a schematic diagram of an embodiment of separation between a display and a supporting device of an electronic device according to the disclosure.
Figure 3:
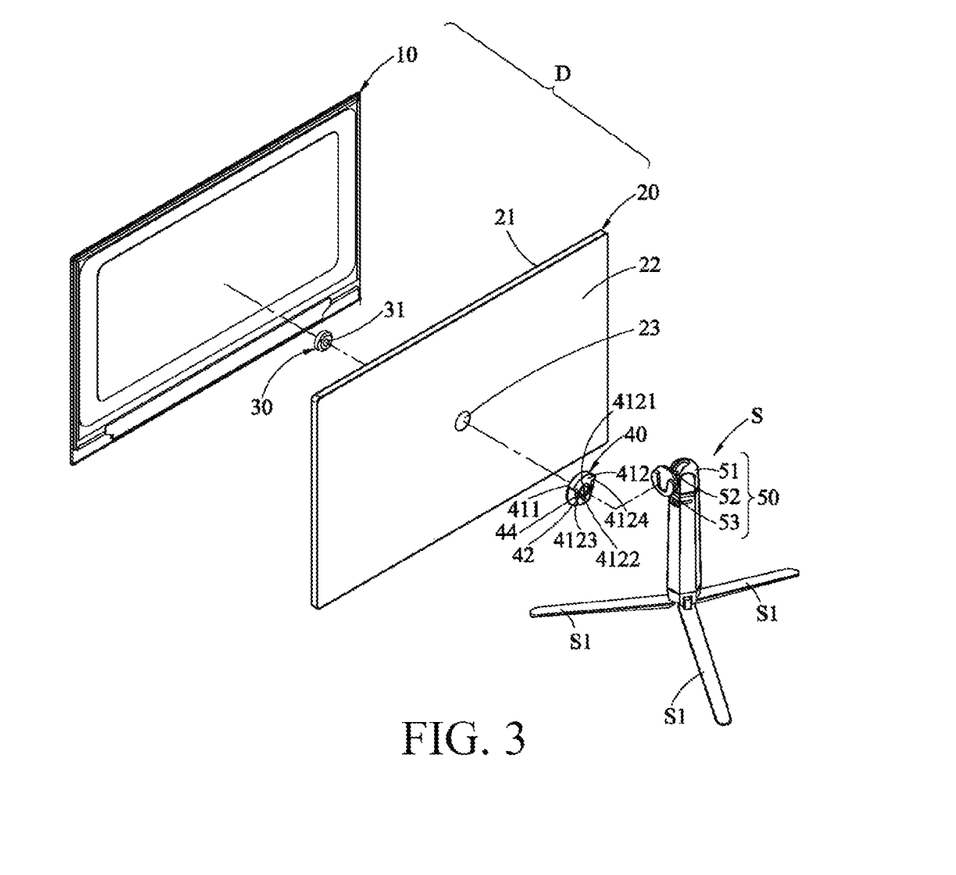
FIG. 3 is a schematic diagram of an embodiment of a disassembled state of a supporting device of an electronic device according to the disclosure.

Referring to FIG. 1 to FIG. 3, the disclosure provides an electronic device. FIG. 1 is a schematic diagram of the electronic device. The electronic device provided in the disclosure includes a display D and a supporting device S.

Referring to FIG. 2 and FIG. 3, the disclosure further provides a display D, applied to connect to a supporting device S. The display D of the disclosure is a television, a computer screen, a tablet computer, or a mobile phone, but the disclosure is not limited thereto.

Figure 4:
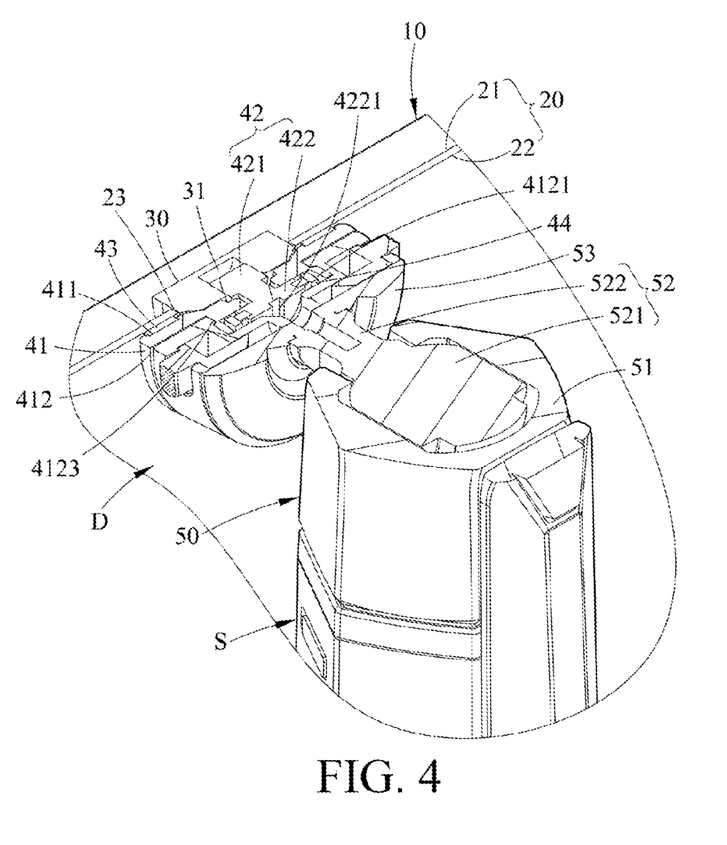
FIG. 4 is a three-dimensional cross-sectional view of a partial structure of a supporting device on which a display is mounted of an electronic device according to the disclosure.

Referring to FIG. 2 to FIG. 4, the display D of the disclosure includes a display panel 10, a back cover 20, and a connecting member 30. The back cover 20 includes an inner surface 21 and an outer surface 22 opposite to each other. The display panel 10 is connected to the inner surface 21 of the back cover 20. The back cover 20 further includes a mounting hole 23 penetrating the inner surface 21 and the outer surface 22. The mounting hole 23 is disposed on a central region of the back cover 20. The connecting member 30 is disposed on the inner surface 21 of the back cover 20, and includes a screw hole 31. The supporting device S includes a detachable fixer 40 connected to the screw hole 31.

Thus, it is convenient for a user to connect the display D to different supporting devices S through the mounting hole 23 of the back cover 20 of the display D.

Referring to FIG. 3 and FIG. 4, in an embodiment, the detachable fixer 40 includes a screw bolt 42, and is connected to the screw hole 31 of the display D by using the screw bolt 42. Thus, the display D is quickly detached from the supporting device S.

Referring to FIG. 3, in an embodiment, the connecting member 30 of the display D is connected to a commonly used supporting device S through the screw hole 31. The screw hole 31 of the connecting member 30 of the display D is of a ¼ inch or ⅜ inch specification of the imperial universal national coarse thread (UNC). Therefore, the screw bolt 42 of the detachable fixer 40 is also of a ¼ inch or ⅜ inch specification of the UNC. It is to be noted that specifications of screw bolts 42 of quick-detach elements used in combination with different tripod head structures on the market are mostly the same as the above. Therefore, the detachable fixer 40 is also a quick-detach element suitable for different tripod heads on the market.

Figure 5:
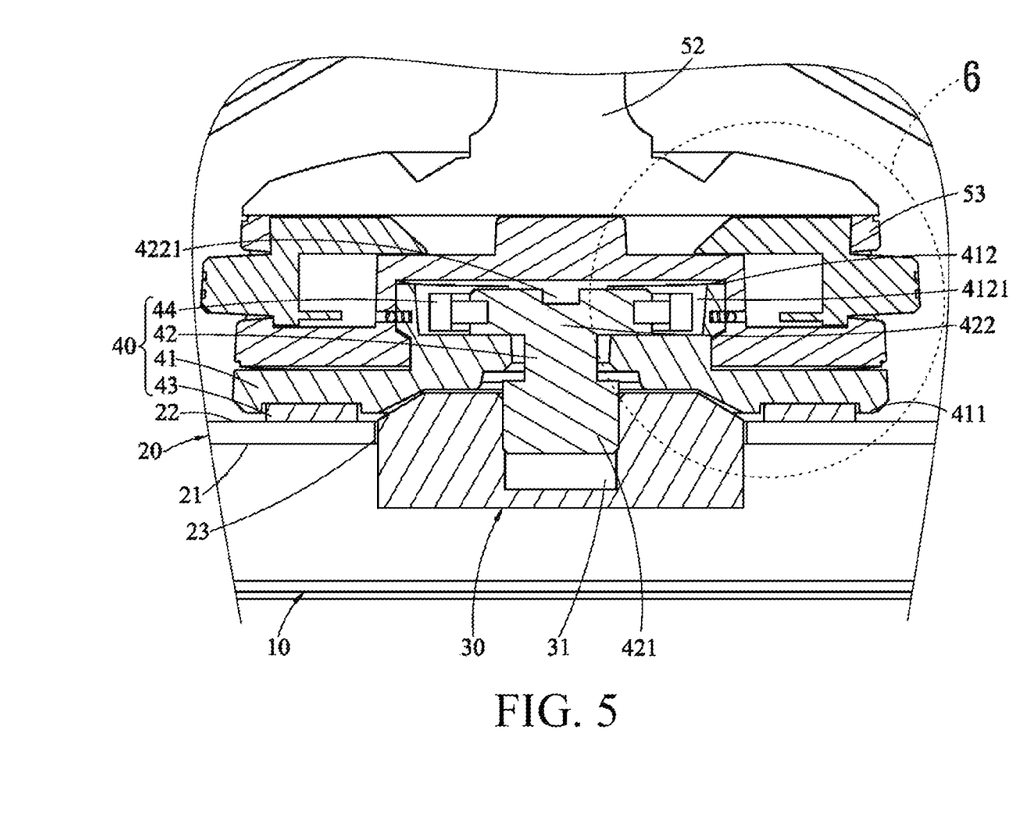
FIG. 5 is a planar diagram of a section in FIG. 4.
Figure 6:
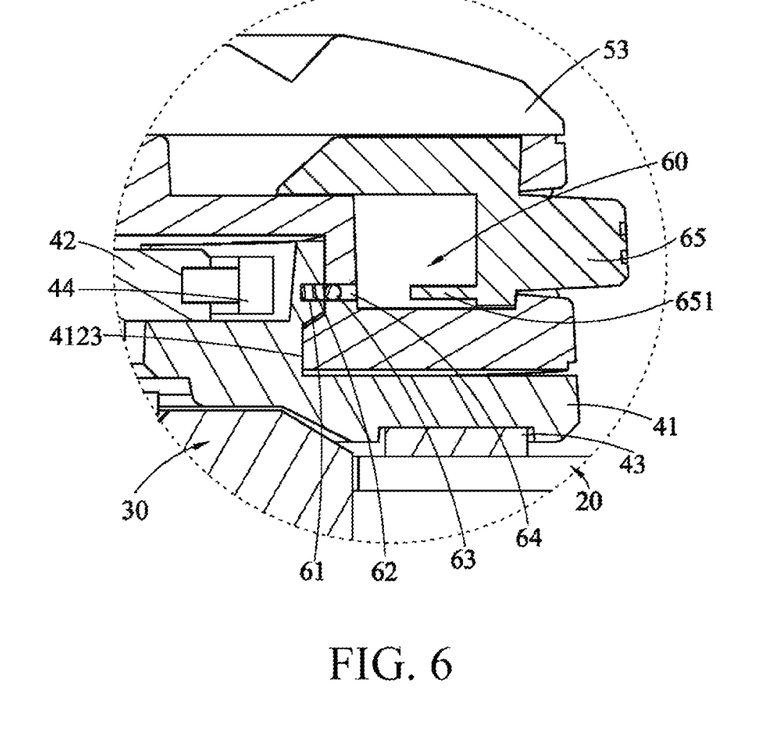
FIG. 6 is a partial enlarged diagram of a circled part 6 in FIG. 5.
Figure 7:
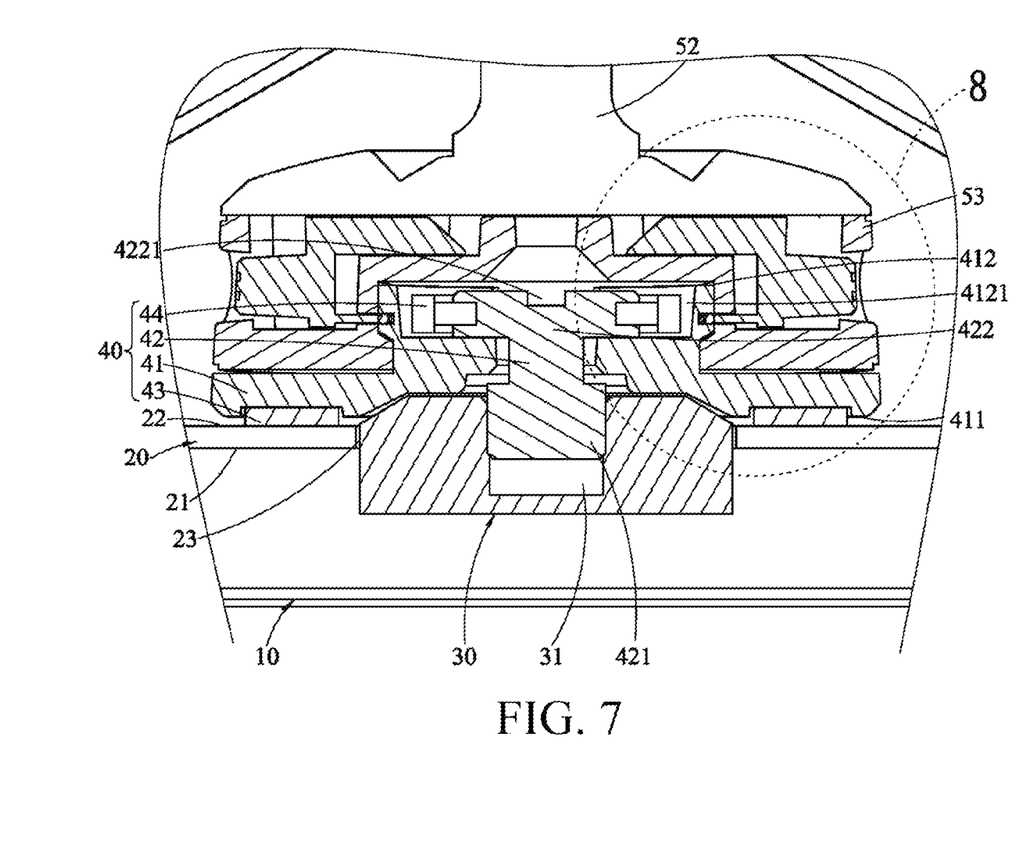
FIG. 7 is a cross-sectional view of an embodiment in which a control button is pressed based on a state in FIG. 5.
Figure 8:
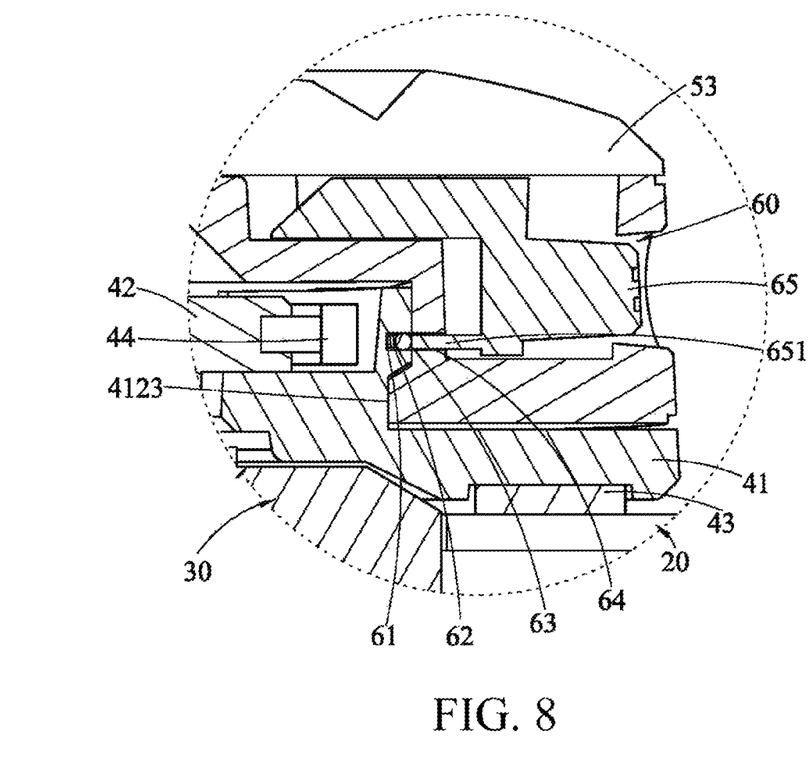
FIG. 8 is a partial enlarged diagram of a circled part 8 in FIG. 7.

Referring to FIG. 4 to FIG. 6, in an embodiment, a pattern of the screw hole 31 of the display D is a blind via hole (BVH) pattern. One end of the screw hole 31 is open outwards the display D, and the other end is closed and located inside the display D. Thus, vapor or dust is prevented from entering the display D due to disposition of the screw hole 31.

Referring to FIG. 4 and FIG. 5, in an embodiment, the detachable fixer 40 further includes a base 41, the screw bolt 42 is disposed on the base 41, and the base 41 of the detachable fixer 40 is detachably connected to the supporting device S.

Referring to FIG. 1 and FIG. 2, in an embodiment, the supporting device S includes types of handheld or standing. In an embodiment, the handheld supporting device S is, but not limited to, a selfie stick. In an embodiment, the standing supporting device S is, but not limited to, a stretchable tripod with an adjustable height or a fixed tripod with a fixed height. In this embodiment, the supporting device S is a standing tripod, and includes a plurality of supporting legs S1 at one end. Herein, the supporting device S further includes a tripod head structure 50 to conveniently adjust an angle of the display D after the supporting device S is connected to the display D. The tripod head structure 50 is disposed on the other end of the supporting device S, and the detachable fixer 40 is detachably connected to the tripod head structure 50.

Referring to FIG. 2, in an embodiment, the tripod head structure 50 includes a tripod head pedestal 51, a connecting shaft 52, and a quick-detach pedestal 53. The tripod head pedestal 51 is fastened to the supporting device S, the connecting shaft 52 is disposed on the tripod head pedestal 51, the quick-detach pedestal 53 is connected to the connecting shaft 52, and the detachable fixer 40 is disposed on the quick-detach pedestal 53.

In an embodiment, the tripod head structure 50 is, but not limited to, a spherical tripod head, a three-dimensional tripod head, a toothed tripod head, a panoramic tripod head, a cantilever tripod head, or a hydraulic tripod head. Different types of tripod head structures 50 lies in that the connecting shaft 52 connecting the tripod head pedestal 51 and the quick-detach pedestal 53 includes different structures and configurations, thus providing different load capabilities, different direction adjustment flexibility, or different stability. The tripod head structure 50 in the embodiment shown in FIG. 2 is a spherical tripod head structure, and the connecting shaft 52 thereof is a spherical shaft.

Referring to FIG. 2, in this embodiment, the connecting shaft 52 includes a spherical portion 521 and a shaft portion 522. The spherical portion 521 is rotatably accommodated in the tripod head pedestal 51, and the shaft portion 522 extends out of the tripod head pedestal 51 and is connected to the quick-detach pedestal 53. The detachable fixer 40 of the display D is detachably disposed on the quick-detach pedestal 53. Thus, the display D can change angles by the detachable fixer 40 and the tripod head structure 50.

Referring to FIG. 2 and FIG. 5, in an embodiment, to increase stability of the display D connecting to the supporting device S by using the detachable fixer 40, a non-slip pad 43 is provided. The non-slip pad 43 is disposed on the base 41 of the detachable fixer 40.

Referring to FIG. 5, in an embodiment, the screw bolt 42 of the detachable fixer 40 includes a first portion 421 and a second portion 422 which are connected with each other. The base 41 includes a first side 411 and a second side 412 that are opposite to each other. The screw bolt 42 is disposed penetrating the base 41, the first portion 421 protrudes out of the first side 411, and the second portion 422 protrudes out of the second side 412. Herein, the first portion 421 includes an external thread to configure to connect to the screw hole 31 of the display D. In this way, the user locks the screw bolt 42 in the screw hole 31 of the display D in a threaded manner by holding and rotating the second portion 422 of the screw bolt 42 by hand, and the detachable fixer 40 is also fastened to the display D.

Referring to FIG. 3 to FIG. 5, in an embodiment, to enable the user to conveniently lock the detachable fixer 40 in the screw hole 31 of the display D by hand, the detachable fixer 40 further includes a ring pull 44. The ring pull 44 is pivoted to the second portion 422 of the screw bolt 42. Thus, when the user intends to lock the detachable fixer 40 in the screw hole 31 of the display D, the user holds the ring pull 44 by hand to drive the screw bolt 42 to rotate the whole detachable fixer 40 to be locked. Herein, the ring pull 44 provides a larger handhold area for the user, which enhances operation convenience.

Referring to FIG. 4 and FIG. 5, in an embodiment, the second side 412 of the base 41 of the detachable fixer 40 further includes a first recess 4121. When the ring pull 44 is not used, the ring pull 44 is pivoted to a state of lying flat on a bottom surface of the first recess 4121, so that the second side 412 of the detachable fixer 40 lies flat on the quick-detach pedestal 53.

Referring to FIG. 3, in an embodiment, the second side 412 of the base 41 of the detachable fixer 40 further includes a second recess 4122. Thus, the user conveniently extends a hand into the second recess 4122 to get and hold the ring pull 44, making it more convenient.

Referring to FIG. 4 and FIG. 5, in an embodiment, an end surface of the second portion 422 of the screw bolt 42 is further provided with an open groove 4221. In addition to directly holding and rotating the screw bolt 42 or the ring pull by hand for locking as in the foregoing embodiment, the user uses a flat-head screwdriver or a coin in combination to extend into the open groove 4221 of the screw bolt 42 to rotate the screw bolt 42, to achieve effects of labor saving and convenience.

Referring to FIG. 3 to FIG. 5, in an embodiment, the detachable fixer 40 is slidably disposed on the quick-detach pedestal 53, and the second side 412 of the detachable fixer 40 further includes a limit groove 4123. Two contact surfaces 4124 are respectively formed at joints between the second side 412 and two ends of the limit groove 4123. Herein, when the detachable fixer 40 is mounted on the quick-detach pedestal 53, the contact surfaces 4124 function as end stops of the mounting action, making it convenient for the user to mount.

Referring to FIG. 5 to FIG. 8, in an embodiment, to lock the detachable fixer 40 connected to the quick-detach pedestal 53, a locking component 60 is further included, which is disposed between the detachable fixer 40 and the quick-detach pedestal 53. The locking component 60 includes an accommodating groove 61, an elastic element 62, a ball 63, a through hole 64, and a control button 65. Herein, the accommodating groove 61 is disposed in the limit groove 4123 of the detachable fixer 40 at a position corresponding to the quick-detach pedestal 53, the elastic element 62 and the ball 63 are accommodated in the accommodating groove 61, and two ends of the elastic element 62 are respectively fastened to the accommodating groove 61 and the ball 63. When the ball 63 or the elastic element 62 is not stressed, the elastic element 62 pushes the ball 63 out of a notch of the accommodating groove 61 (referring to a state in FIG. 5 and FIG. 6).

The through hole 64 is disposed on the quick-detach pedestal 53 at a position corresponding to the limit groove 4123 of the detachable fixer 40. When the detachable fixer 40 is mounted on the quick-detach pedestal 53, the elastic element 62 of the locking component 60 is correspondingly accommodated in the through hole 64 of the quick-detach pedestal 53, to lock the detachable fixer 40 and the quick-detach pedestal 53. Thus, the detachable fixer 40 and the quick-detach pedestal 53 are connected in a most stable state.

The control button 65 is movably disposed on the quick-detach pedestal 53, and the control button 65 includes an extended pin portion 651 a position corresponding to the through hole 64. When the locked state between the detachable fixer 40 and the quick-detach pedestal 53 is to be released, the control button 65 is pressed to extend the extended pin portion 651 into the through hole 64 and push the ball 63 back to the accommodating groove 61. In this way, the locked state between the detachable fixer 40 and the quick-detach pedestal 53 is released (referring to a state in FIG. 7 and FIG. 8).

Although the disclosure is described above by using the embodiments, the embodiments are not intended to limit the disclosure. A person of ordinary skill in the art may make variations and modifications without departing from the spirit and scope of the disclosure. Therefore, the protection scope of the disclosure is subject to the claims.

What is claimed is:

1. An electronic device, comprising:
   a display, comprising:
   a display panel;
   a back cover, disposed on the display panel, the back cover comprising an inner surface, an outer surface opposite to the inner surface, and a mounting hole penetrating the inner surface and the outer surface, the inner surface facing the display panel, and the mounting hole disposed on a central region of the back cover; and
   a connecting member, disposed on the inner surface at a position corresponding to the mounting hole, and comprising a screw hole; and
   a supporting device, comprising a detachable fixer connected to the screw hole, the detachable fixer comprises a screw bolt and a base, the screw bolt is disposed on the base and connected to the screw hole, and the base is detachably connected to the supporting device;
   wherein the screw bolt and the detachable fixer are both corresponding to a tripod head;
   wherein the screw bolt comprises a first portion and a second portion, the base comprises a first side and a second side, the first portion is located on the first side, the second portion is located on the second side, and the first portion is configured to connect to the screw hole.

2. The electronic device according to claim 1, further comprising a non-slip pad, disposed on a base of the detachable fixer and around the screw bolt.

3. The electronic device according to claim 2, wherein the non-slip pad is made of rubber.

4. The electronic device according to claim 1, wherein the second portion further comprises an open groove.

5. The electronic device according to claim 1, further comprising a ring pull, pivoted to the second portion.

6. The electronic device according to claim 5, wherein the second side of the base further comprises a first recess, and the ring pull pivotally contacts with the first recess.

7. The electronic device according to claim 6, wherein the second side of the base further comprises a second recess, and the second recess is communicated with the first recess.

8. The electronic device according to claim 6, wherein the second side of the base further comprises a second recess, and the second recess is communicated with the first recess.

9. A display, applied to connect to a supporting device comprising a detachable fixer, comprising:
   a display panel;
   a back cover, disposed on the display panel, the back cover comprising an inner surface, an outer surface opposite to the inner surface, and a mounting hole penetrating the inner surface and the outer surface, the inner surface facing the display panel, and the mounting hole disposed on a central region of the back cover;
   a connecting member, disposed on the inner surface at a position corresponding to the mounting hole, and comprising a screw hole; and
   the detachable fixer comprises a screw bolt and a base, the screw bolt is disposed on the base and connected to the screw hole, and the base is detachably connected to the supporting device;
   wherein the screw hole is applied to connect the display to the detachable fixer of the supporting device and the screw bolt and the detachable fixer are both corresponding to a tripod head;
   wherein the screw bolt comprises a first portion and a second portion, the base comprises a first side and a second side, the first portion is located on the first side, the second portion is located on the second side, and the first portion is configured to connect to the screw hole.

* * * * *